(12) United States Patent
Kamenov et al.

(10) Patent No.: US 7,355,791 B2
(45) Date of Patent: Apr. 8, 2008

(54) OPTICAL SYSTEM AND PHOTOLITHOGRAPHY TOOL COMPRISING SAME

(75) Inventors: Vladimir Kamenov, Essingen (DE); Toralf Gruner, Aalen-Hofen (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 11/251,300

(22) Filed: Oct. 14, 2005

(65) Prior Publication Data

US 2006/0066764 A1 Mar. 30, 2006

Related U.S. Application Data

(63) Continuation-in-part of application No. PCT/EP03/04015, filed on Apr. 17, 2003.

(51) Int. Cl.
*G02B 5/30* (2006.01)
(52) U.S. Cl. ..................... 359/500; 359/497
(58) Field of Classification Search ............ 359/499, 359/497, 500
See application file for complete search history.

(56) References Cited

U.S. PATENT DOCUMENTS

| | | | |
|---|---|---|---|
| 6,593,998 | B2 | 7/2003 | Gruner et al. |
| 6,697,199 | B2 | 2/2004 | Gerhard et al. |
| 2003/0011893 | A1 | 1/2003 | Shiraishi et al. |
| 2003/0011896 | A1 | 1/2003 | Shiraishi |
| 2003/0197946 | A1* | 10/2003 | Omura ................... 359/649 |
| 2003/0234981 | A1 | 12/2003 | Hoffman et al. |
| 2004/0105170 | A1 | 6/2004 | Krahmer et al. |
| 2004/0227988 | A1 | 11/2004 | Albert et al. |
| 2005/0180023 | A1 | 8/2005 | Totzeck et al. |
| 2005/0200966 | A1 | 9/2005 | Totzeck et al. |

FOREIGN PATENT DOCUMENTS

| | | |
|---|---|---|
| WO | WO 02/093209 | 11/2002 |
| WO | WO 02/099500 | 12/2002 |
| WO | WO 03/009050 A | 1/2003 |
| WO | WO 03/009062 | 1/2003 |
| WO | WO 04/023184 | 3/2004 |

\* cited by examiner

*Primary Examiner*—William C Choi
(74) *Attorney, Agent, or Firm*—Fish & Richardson P.C.

(57) ABSTRACT

An optical system, for example a lens for a photolithography tool, includes a group of optical elements (L1, L2) that each comprise a birefringent cubic crystal such as $CaF_2$. The crystal lattices of the crystals have different orientations, e.g. for reducing the overall retardance of the group by mutual compensation. The [110] crystal axis of at least one optical element (L1, L2) is tilted with respect to an optical axis (34) of the system (10) by a predefined tilting angle ($\theta_1$, $\theta_2$) having an absolute value between 1° and 20°. This reduces the magnitude, but not significantly changes the orientation of intrinsic birefringence. By selecting an appropriate tilting angle it is possible to achieve a better performance of the optical system. For example, the overall retardance of the optical system may be reduced, or the angular retardance distribution may be symmetrized.

28 Claims, 4 Drawing Sheets

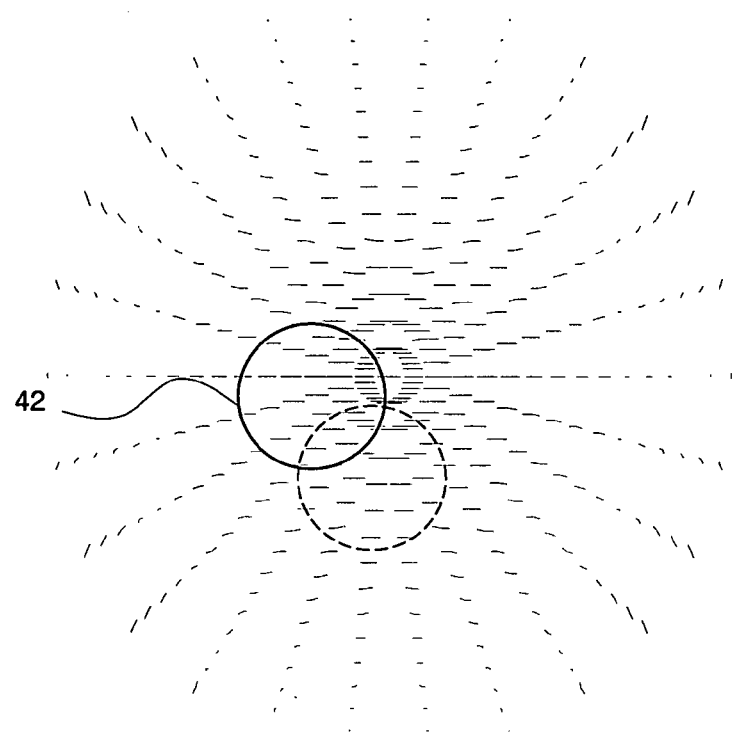
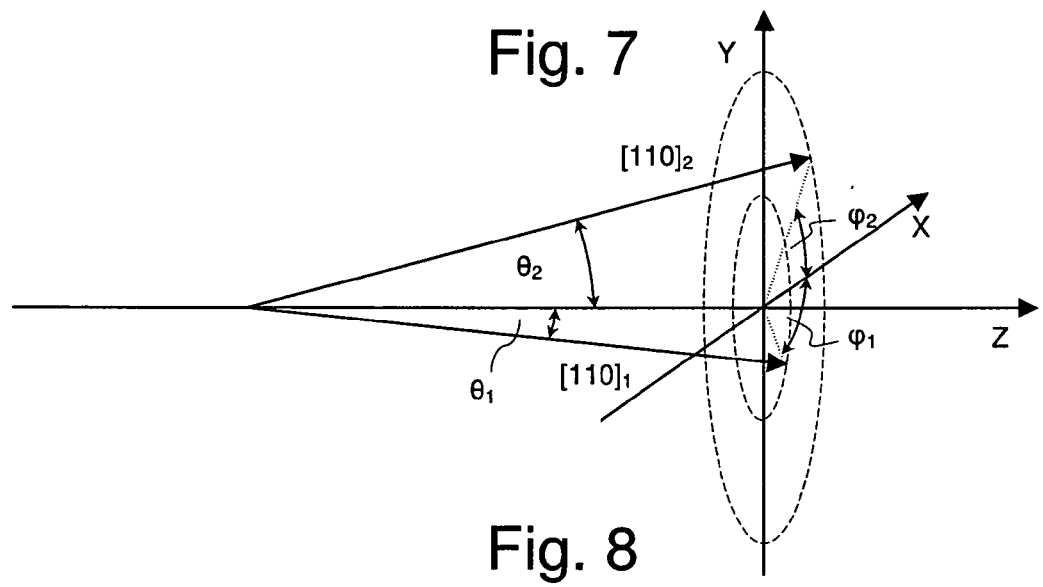
Fig. 7
Fig. 8

OPTICAL SYSTEM AND PHOTOLITHOGRAPHY TOOL COMPRISING SAME

CROSS-REFERENCE TO RELATED APPLICATIONS

This application is a continuation-in-part application of International Application PCT/EP2003/04015, with an international filing date of Apr. 17, 2003. The full disclosure of this International Application is incorporated herein by reference.

BACKGROUND OF THE INVENTION

1. Field of the Invention

The present invention relates to optical systems, in particular to photolithography tools, including a group of optical elements that each comprises a birefringent cubic crystal.

2. Description of Related Art

Photolithography tools are commonly used in the fabrication of electrical and optical integrated circuits for forming images of device patterns on semiconductor substrates. Since the resolving power of such tools is inversely proportional to the exposure wavelength, new generations of such tools generally use exposure light with a shorter wavelength than used by tools of the previous generation. At present, deep ultraviolet light having a wavelength of 248 nm is used for submicron lithography. The next generations of photolithography tools will use exposure light with wavelengths of 193 and even 157 nm.

One of the major problems encountered when using exposure light having such short wavelengths is the fact that conventional lens materials such as quartz crystals or glasses are not sufficiently transparent in the deep ultraviolet wavelength domain. Among the most promising materials that could one day completely replace conventional lens materials is a class of single crystal fluoride materials that have, for the wavelengths of interest, much higher transmittances than conventional lens materials. Thus far calcium fluoride ($CaF_2$) seems to be the most promising candidate within this material class; other cubic crystals belonging to that class include barium fluoride, lithium fluoride and strontium fluoride.

Of prime concern for the use of cubic crystalline materials for optical elements in deep ultraviolet lithography tools is the anisotropy of refractive index that is inherent in cubic crystalline materials and commonly referred to as "intrinsic birefringence". Since the intrinsic birefringence scales approximately as the inverse of the wavelength of light, the issue of birefringence becomes particularly significant if the exposure wavelength approaches 100 nm.

In birefringent materials, the refractive index varies as a function of the orientation of the material with respect to the direction of incident light and also of its polarization. As a result, unpolarized light propagating through a birefringent material will generally separate into two beams with orthogonal polarization states. When light passes through a unit length of a birefringent material, the difference in refractive index for the two ray paths will result in an optical path difference or retardance. The retardance causes wavefront aberrations that are usually referred to as "retardance aberrations" and are capable of significantly degrading image resolution and introducing distortion of the image field at the wavelength of interest.

One of the most interesting approaches for addressing the problem of retardance aberrations is to combine an optical system with several cubic crystals whose crystal lattices are oriented with respect to each other in such a way that the overall retardance is reduced by mutual compensation. The underlying idea is to exploit the fact that, if a first polarization state is retarded in one crystal, a second polarization state being orthogonal to the first one may be retarded in another crystal of the optical system. As a result, the retarded wavefront of the first polarization state may "catch up" with the wavefront of the second polarization state while the latter is retarded in the other crystal. The overall net retardance of both crystals, i.e. the difference between both retardances imposed on the different polarization states, may then be considerably reduced or even made to vanish.

In WO 02/093209 an optical system is described comprising two groups each including two lenses that are made of cubic crystals. In one group, two crystals forming the lenses are oriented such that each [111] crystal axis (or an equivalent crystal axis such as the [11-1] axis, for example) coincides with the optical axis that is defined as the symmetry axis of the optical system. The orientations of the crystal lattices of both crystals differ in that the crystal lattice of one of the crystals results from rotating the crystal lattice of the other crystal around the optical axis by 60°. As a result of this rotation that is often referred to as "clocking", the rotational asymmetry of birefringence that is inherent to each single crystal is substantially reduced if taking the group as a whole.

Within the other group the two lenses are made of crystals whose crystal lattices are oriented such that each [100] crystal axis coincides with the optical axis of the optical system. Again, the crystal lattices are rotated around the optical axis, but in this case by only 45°. Also in this group the birefringences of both crystals combine such that the overall birefringence of the group is almost rotational symmetrical.

However, since the birefringences induced in both lens groups have different signs, different polarization states are retarded in each group. This opens the way for mutually compensating the effects of birefringence induced in both lens groups. As the birefringence in both lens groups differs in sign, but approximately equals in magnitude, rotational asymmetry and the overall retardance of the whole system comprising both lens groups can be significantly reduced if both polarization states travel the same path lengths within each crystal.

A similar approach is also disclosed in U.S. 2003/0011896 A1.

In both documents it is stated that the angular deviation between the optical axis and the crystal axis that is to coincide with the optical axis shall not exceed 4° or 5°. Apparently, deviations from perfect alignment are not desired and may, if they exceed certain limits, impede the advantageous effects intended by the proposed crystal lattice orientations.

However, as has been briefly mentioned above, a good compensation of the overall retardance induced by birefringence requires that the retardances induced in both lens groups affect orthogonal polarization states, but have the same magnitude. The magnitude of the retardance is determined by the product of birefringence and path length; thus, equal retardances can only be achieved if this product is, for a given light ray, constant in both lens groups. Since the birefringence itself is, in the case of cubic crystals, a function of the angle of incidence, not only the angular birefringence distribution, but also the path length and the angle of incidence have to be taken into account.

The same considerations also apply, mutatis mutandis, in those cases in which the design objective is not (or not exclusively) the reduction of overall retardance, but to positively affect the retardance or its angular pupil distribution for achieving other advantageous effects. For example, in many cases it is more desirable to have a particular symmetric angular retardance distribution than to achieve a minimum mean retardance. It then does not suffice to provide two crystals or crystal groups whose sum of the birefringence distributions is symmetrical. Instead, achieving a desired symmetry of the angular retardance distribution also requires taking into account the paths lengths and angles of incidence of light rays propagating through the optical elements. The desired retardance distribution generally depends on the properties of other polarization selective optical elements within the optical system, for example beam splitter coatings, anti-reflection coatings or quarter wave plates.

Unfortunately, the path lengths and angles of incidence of the rays through the lenses cannot be varied just at it would be required for achieving the desired retardance property. This is because the shape of the lenses, their arrangement within the optical system and thus also the optical paths taken by light rays when propagating through the lenses are almost completely determined by the design of the optical system as a whole in view of the imaging properties that are to be achieved.

As a result, these known approaches make it possible to considerably reduce, symmetrize or generally positively affect the retardance only in very restricted circumstances in which, for a given polarization state, the angles of incidence and the path lengths within the crystals have the necessary values. This considerably qualifies the application of these approaches.

SUMMARY OF THE INVENTION

It is therefore an object of the invention to provide an optical system as mentioned at the outset having improved retardance properties, for example a reduced mean retardance or a more symmetrical angular retardance distribution.

According to the invention, this object is solved, with an optical system as mentioned at the outset, in that the a crystal axis of at least one optical element is tilted with respect to an optical axis of the system so that a predefined tilting angle having an absolute value between 1° and 20° is formed between said crystal axis and the optical axis, thereby improving at least one predefined retardance property of the group.

It is to be understood that in the present context all references to a particular crystal axis such as the [110] crystal axis are meant to include all crystal axes that are equivalent to this particular crystal axis. For the [110] crystal axis, for example, the crystal axes. [-110], [1-10], [-1-10], [101], [10-1], [-101], [1-0-1], [011], [0-11], [01-1] and [0-1-1] are equivalent.

Instead of following the conventional approach, i.e. attempting to align a particular crystal axis as good as possible with the optical axis, the invention proposes to deliberately introduce a tilting angle between this crystal axis and the optical axis. It has been found out that by carefully choosing the new design parameter "tilting angle" it is possible to significantly improve a retardance property such as the magnitude or the angular distribution of the retardance.

In a particularly preferred embodiment the tilted crystal axis is the [110] crystal axis of the at least one optical element.

This advantageous embodiment is based on the finding that, at least for small angles of incidence for incoming light rays, the birefringence of cubic crystals, which are aligned such that the [110] crystal axis coincides with the optical axis of the system, has almost a constant orientation irrespective of the angle of incidence. Only the magnitude of birefringence will be significantly reduced if the angle of incidence is increased. For the sake of clarity the term "angle of incidence" shall hereinafter denote the angle formed between an incident light ray and the [110] crystal axis. If the latter is tilted with respect to the optical axis, the angle of incidence differs from the angle formed between an incident light ray and the optical axis that will, in this context, be referred to as "aperture angle". It should further be noted that neither the angle of incidence nor the aperture angle relate to the angle that is formed between a light ray and a surface of a lens. Further it should be clear that—as has already been indicated above—tilting the [110] crystal axis does not affect the lens surfaces but only the orientation of the crystal lattice. This orientation has to be taken into account when grinding the lens and possibly when mounting it in the optical system.

Since tilting the [110] crystal axis with respect to the optical axis increases, in the average, the angles of incidence, the overall effect is a decrease of the magnitude of the birefringence, whereas the orientation of the birefringence is not substantially altered. Therefore this embodiment makes it possible to selectively reduce the magnitude of intrinsic birefringence in cubic crystals in [110] crystal lattice orientation.

Because only the crystal lattice is tilted but not the lens as a whole, the path lengths of rays propagating through the lens are not affected. Consequently, this embodiment can be used not only to selectively reduce the magnitude of birefringence, but to reduce the retardance itself as the more relevant quantity for the imaging quality of the optical system.

Thus it is now possible, for example, to achieve an even better mutual compensation of retardances induced by cubic crystals in different crystal orientations by "downtuning" the retardance of the crystal(s) in [110] orientation to a desired value. It should be clear, however, that this embodiment can also be advantageously employed in those cases in which quite generally an alteration of birefringence may be desirable for whatever reason, e.g. for achieving a better symmetry of the angular distribution of the retardance.

If the tilting angle exceeds 20° in this embodiment, the approximation that the orientation of the birefringence is almost independent of the angle of incidence does not hold true any more. Thus tilting the [110] crystal axis by angles substantially larger than 20° will not only reduce the magnitude of birefringence but also alter its orientation. On the other hand, for very small tilting angles (<1°) even the magnitude of birefringence is only weakly affected by variations of the angle of incidence so that no substantial reduction of the magnitude of birefringence can be achieved. Thus it is preferred—not only in this embodiment—if the absolute value of the tilting angle is between 6° and 12°.

In those cases in which the crystal lattices of the crystals are oriented with respect to each other such that the overall retardance of the group is reduced by mutual compensation, it will be often desirable to define the tilting angle such that the overall retardance of the group is even further reduced.

Then the selection of the tilting angle is preferably made such that the overall retardance of the group of optical elements is minimal. The minimum retardance can be determined by computer simulation or by experiment.

In certain instances, however, it may be difficult to manufacture an optical element with the ideal tilting angle that would result in a minimal retardance of the group of optical elements. In these cases it may be appropriate to ease the constraint of choosing the optimum tilting angle. The tilting angle could then be defined such that the overall retardance of the group does not deviate more than 5% from a minimum value that would be obtained with an ideal tilting angle.

Alternatively, the tilting angle can also be defined such that the angular retardance distribution of the group has a predetermined form. This form may display a particular symmetry such as a rotational symmetry or an n-fold symmetry. Also in this case the optimum tilting angle can be determined either by computer simulation or by experiment.

For small angles of incidence the birefringence of crystals in [110] orientation is almost symmetrical, i.e. it does not substantially depend on the azimuth angle. Thus, in a first approximation, the choice of the tilting axis is generally of no concern in this embodiment. However, this is only an approximation, and in many cases a further improvement of the retardance properties can be achieved if a particular tilting axis is selected. Apart from that, the fabrication of the optical elements can be simplified if the crystal lattices are tilted along a particular crystal axis. The choice of the latter generally depends on other polarization selective optical elements within the optical system such as beam splitter coatings, anti-reflection coatings or quarter wave plates.

In this embodiment it is further preferred to tilt the [110] crystal axis of the at least one optical element along a tilting axis that is at least substantially parallel to the [1-10] or [00-1] crystal axis. This has the advantage that the resulting retardance distribution is more symmetrical than with other tilting axes. Furthermore, the computation and fabrication of the optical elements is simplified.

The aforementioned embodiment can be advantageously employed in an optical system in which the group of optical elements comprises a further optical element whose crystal lattice orientation results from rotating the crystal lattice of the at least one optical element by 90° around its [110] crystal axis and then tilting the lattice so that the [110] crystal axis is parallel to the optical axis of the optical system. In such a group of optical elements the at least one optical element and the further optical element are combined in such a way that the overall retardance of the group is reduced by mutual compensation and/or the angular pupil distribution of the retardance is advantageously affected. The at least one optical element is the optical element within the group whose retardance has to be altered for achieving the desired effect.

In general an optical system may comprise a plurality of optical elements made of cubic crystals in [110] orientation but with their [110] crystal axis tilted with respect to the optical axis. For example, in the aforementioned group comprising only two [110] oriented crystals rotated by 90° the lattice of one crystal may be tilted by a tilting angle $\alpha_1$ and the lattice of the other by a tilting angle $\alpha_2$. This is advantageous because, due to the small dependence of the birefringence on the azimuth angle that has been mentioned above, there are now two crystals that affect the angular pupil distribution of the retardance, and thus there are more degrees of freedom to shape the resulting pupil retardance distribution as desired.

As it has been mentioned before in the context of the advantageous embodiment, a reduction of the magnitude of birefringence without altering its orientation is only possible for small angles of incidence. Therefore it is preferred if the at least one optical element is mounted within the optical system such that the aperture angle of light rays impinging on the at least one optical element is less than 20°, preferentially less than 15°.

Such conditions can be found in many optical systems and also in photolithography tools. Many photolithography tools, for example, comprise a catadioptric part including a curved mirror. In this catadioptric part the aperture angles are comparatively small and often fall in the range mentioned above.

With respect to a method of reducing retardance in an optical system as mentioned at the outset, the above stated object is achieved by the following additional step of tilting the crystal axis, which is aligned with the optical axis, of at least one optical element (L1, L2) so that a predefined tilting angle ($\theta_1$, $\theta_2$) having an absolute value between 1° and 20° is formed between said crystal axis and the optical axis, thereby improving at least one predefined retardance property of the group.

The above remarks with respect to the advantages and further improvements of the invention apply to this method correspondingly.

BRIEF DESCRIPTION OF THE DRAWINGS

Various features and advantages of the present invention may be more readily understood with reference to the following detailed description taken in conjunction with the accompanying drawings in which:

FIG. 7 is a graphical illustration showing the angular birefringence distribution across the pupil for a crystal lattice in another orientation;

FIG. 8 is a diagram showing an arbitrary orientation of [110] crystal axes of two optical elements.

DETAILED DESCRIPTION

Figure 1:
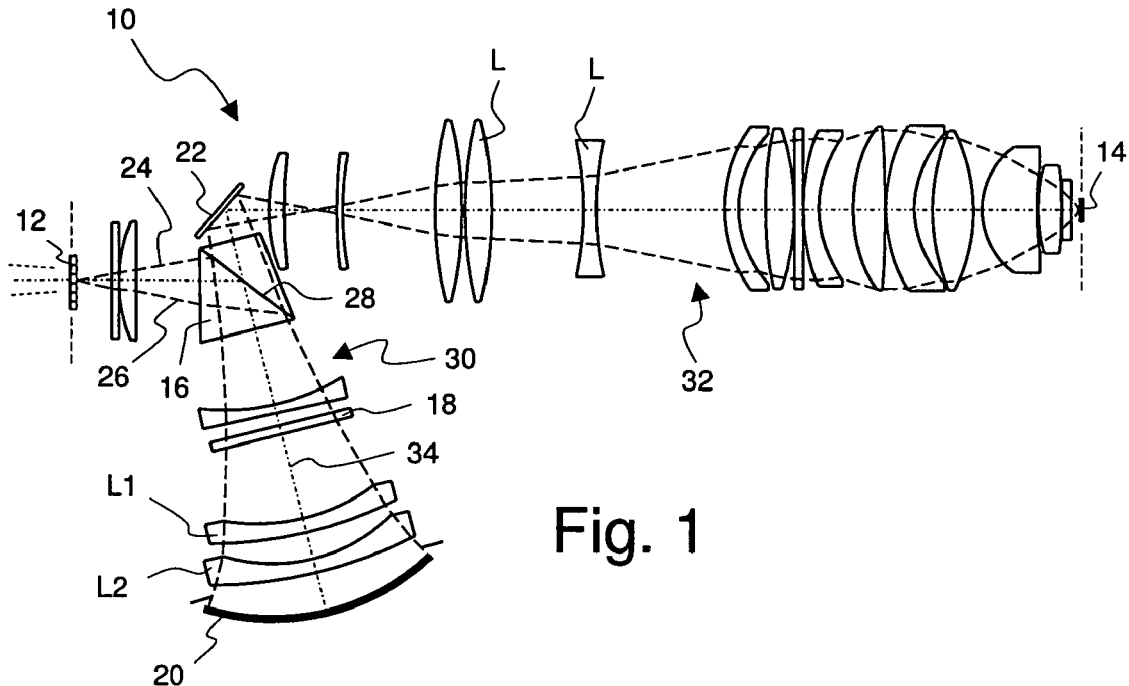
FIG. 1 is a schematic illustration showing an exemplary projection lens for a photolithography tool.

FIG. 1 shows schematically an optical system 10 that is part of a photolithography tool and commonly referred to as a projection lens. The optical system 10 is disposed between a reticle 12 and a substrate 14 that are arranged in an object plane and an image plane, respectively, of the optical system 10. The reticle 12 includes a mask pattern of clear and opaque sections forming the object field which is to be projected through the optical system 10 onto a photosensitive coating. This coating is deposited on the substrate 14 which could be a semiconductor wafer, for example. The optical system 10 is designed such that the mask pattern projected onto the substrate 14 is uniformly reduced in size by a factor such as 4:1.

The optical system 10 includes a plurality of optical elements such as lenses generally denoted by L, a beam splitter cube 16, a retarder 18 and a tilted mirror 22. The optical system 10 is also referred to as a catadioptric lens because it does not only include refractive (dioptric) elements, but includes a catadioptric part 30 containing a reflective element in the form of a spherical mirror 20. The design of such catadioptric lenses is known as such and will therefore not be explained in more detail herein.

The optical system 10 is designed for a projection wavelength in the deep ultraviolet wavelength domain, for example for a wavelength of 157 nm. Since glasses or quartz are not sufficiently transparent at such short wavelengths, some or all lenses L of the optical system 10 are made of a cubic crystalline material such as calcium fluoride, strontium fluoride, barium fluoride, lithium fluoride, YAG (Ytterbium aluminum garnet), LuAG (lutetium aluminum garnet) or spinel ($Mg_xAl_{2-x}O_4$).

In FIG. 1 two marginal rays 24 and 26 emanating from an object point on the reticle 12 are indicated in broken lines. The rays 24, 26 enter the beam splitter cube 16, are reflected from a polarization selective surface 28 contained therein and travel in a downward direction through the catadioptric part 30 towards the spherical mirror 20. After reflection from the spherical mirror 20, the rays 24, 26 are transmitted by the polarization selective surface 28 because their polarization has now been rotated due to the double passing through the retarder 18. The rays 24, 26 are then reflected from the tilted mirror 22 and propagate through a dioptric part 32 of the optical system 10 towards the substrate 14.

Figure 2:
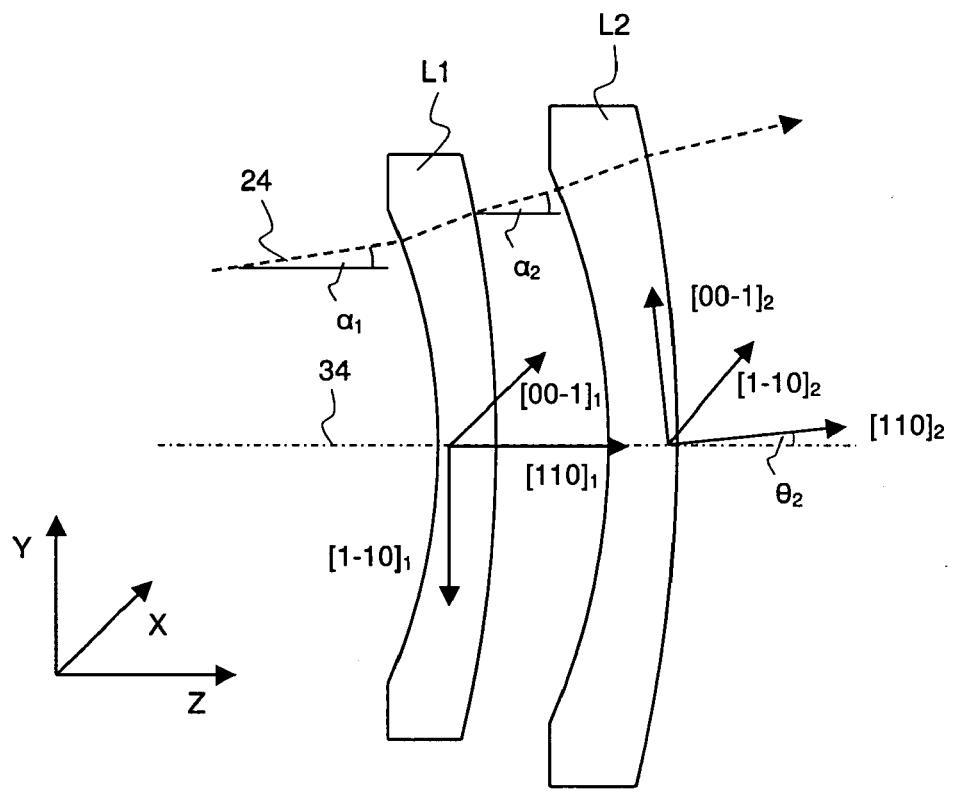
FIG. 2 is an enlarged view showing two optical elements mounted in a catadioptric part of the projection lens shown in FIG. 1.

FIG. 2 shows an enlarged view of two lenses L1 and L2 that are mounted in the optical system 10 most proximate to the spherical mirror 20. Both lenses L1, L2 are made of calcium fluoride crystals whose crystal lattices are oriented as indicated in FIG. 2. In order to simplify the notation, the crystal axes of the lens 1 will be indicated in the following by an index 1 and the crystal axes of the lens 2 by an index 2. For lens 1, the $[110]_1$ crystal axis is aligned parallel to the optical axis 34 of the optical system 10. The optical axis 34 is the symmetry axis of both lenses L1 and L2 and also defines the Z-direction in a Cartesian system of coordinates which is shown to the left in FIG. 2. The crystal axes $[00\text{-}1]_1$ and $[1\text{-}10]_1$ that are perpendicular to the crystal axis $[110]_1$ are oriented along the X and Y direction, respectively.

The crystal lattice of the lens L2 may be obtained from the crystal lattice of the lens L1 by first rotating the crystal lattice around the $[110]_1$ crystal axis by 90° and then tilting the $[110]_1$ crystal axis by an angle $\theta_2$ around the X direction that coincides with the $[1\text{-}10]_1$ crystal axis.

Figure 3:
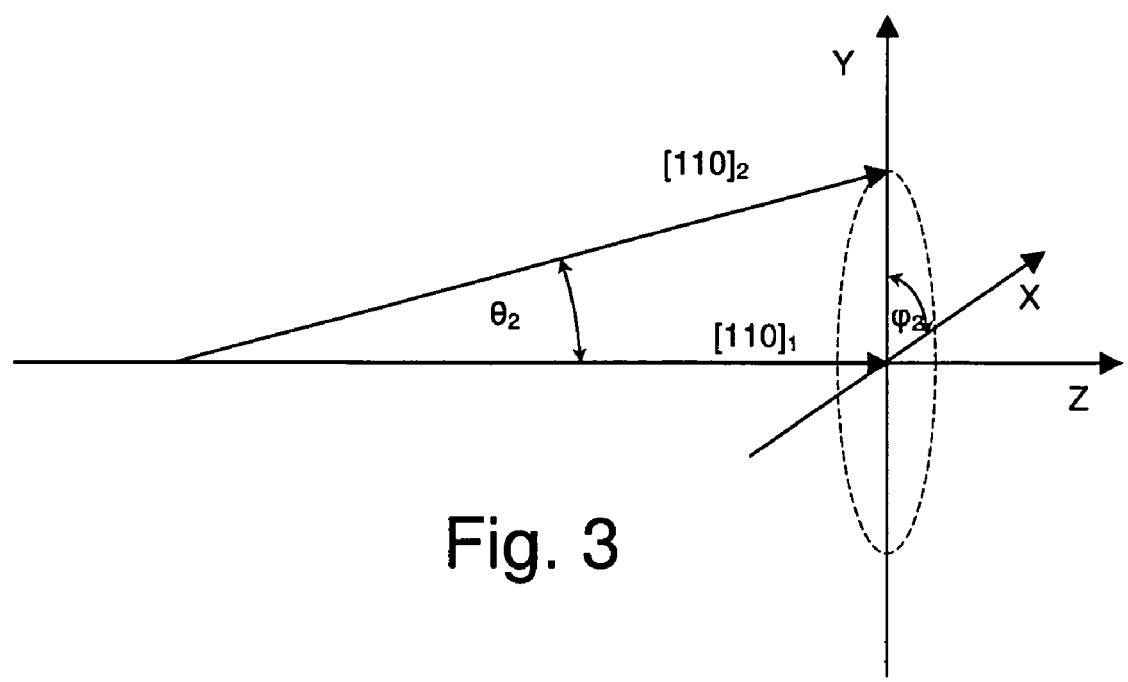
FIG. 3 is a diagram showing the orientation of the [110] crystal axes of the two optical elements shown in FIG. 2.

The orientation of the crystal axes $[110]_1$ and $[110]_2$ of the lenses L1 and L2, respectively, with respect to the optical axis 34 is also shown in more detail in FIG. 3. There it can be seen that tilting the crystal lattice of the lens L2 around the X direction by an angle $\theta_2$ results in an azimutal angle $\phi_2$ of 90° with respect to the X direction.

Figure 4:
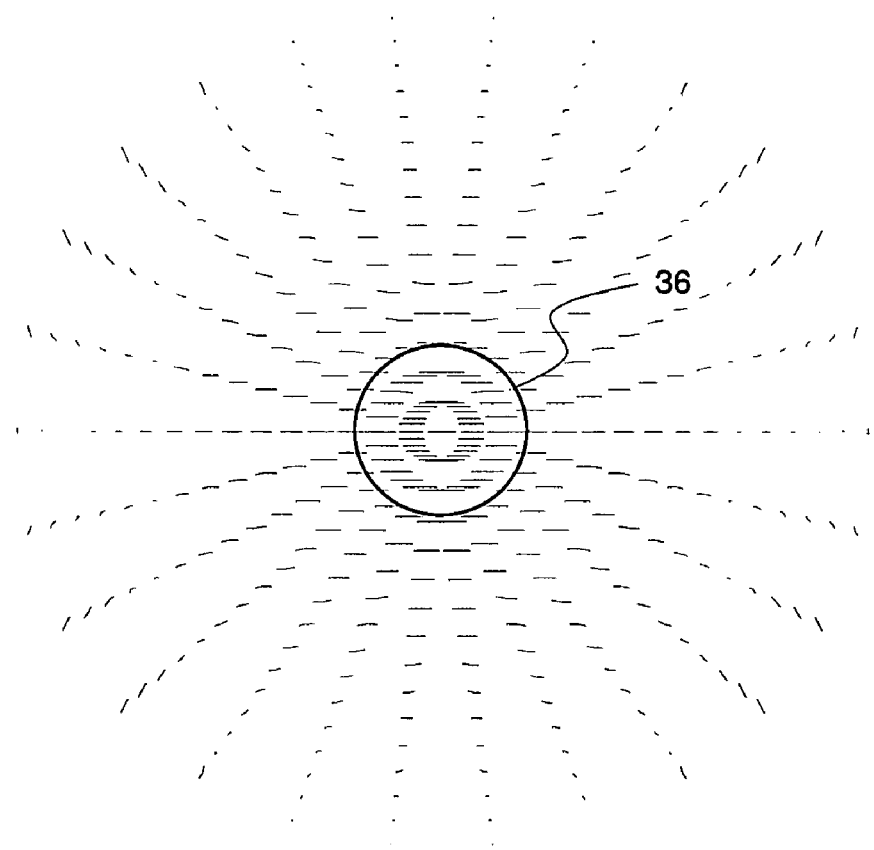
FIG. 4 is a graphical illustration showing the angular birefringence distribution across the pupil for the optical element whose [110] crystal axis coincides with the optical axis.

FIG. 4 is a schematic representation of the variations in birefringence magnitude and birefringence axis orientation in angular space for the crystal of the lens L1. The centre of the plot represents the birefringence encountered by a ray traveling along the [110] crystal axis, i.e. normal to the plane of the illustration in FIG. 4 and, for the lens L1, parallel to the optical axis 34 in FIG. 2. Lines plotted at increased radial distance from the centre represent the birefringence for rays at increased angles of incidence, i.e. for larger angles between the propagation direction of the light ray and the [110] crystal axis. The birefringence axis is indicated in FIG. 4 by the direction of the plotted lines, whereas the magnitude is indicated by the length of the lines.

As can be seen in FIG. 4, light rays with very small angles of incidence are exposed to a birefringence that is, both in terms of birefringence axis and magnitude of birefringence, almost independent of the angle of incidence. For larger angles of incidence the birefringence axis does not significantly vary, but its magnitude decreases. If the angle of incidence is further enlarged, there will be a variation of the birefringence axis as well as of the magnitude of the birefringence.

In the catadioptric part 30 of the optical system 10 the aperture angle of the exposure light is comparatively small. As shown in FIG. 2, the marginal ray 24 has an aperture angle $\alpha_1$ before entering the lens L1 and an aperture angle $\alpha_2$ before entering the lens L2. The aperture angle increases (i.e. $\alpha_2 < \alpha_1$) because both lenses L1 and L2 are dispersing lenses.

The maximum aperture angle $\alpha_{max}$ that a ray may have when entering the lens L1 is schematically indicated in FIG. 4 by a circle 36 drawn in a solid line. From this graphical representation it becomes apparent that for different rays entering the lens L1 the magnitude of birefringence may be (slightly) different, but the axis of birefringence is more or less the same irrespective of the angle of incidence.

Figure 5:
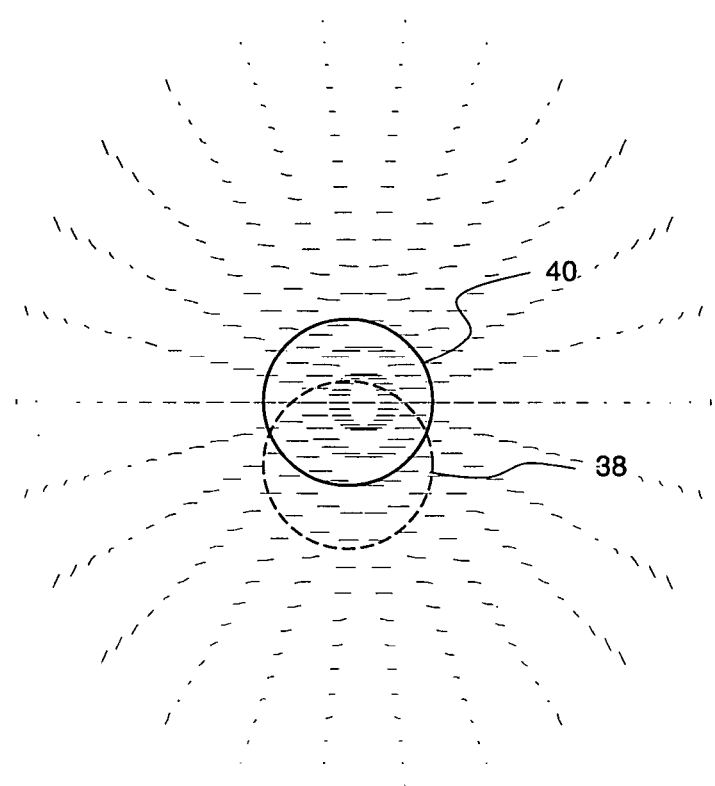
FIG. 5 is a graphical illustration showing the angular birefringence distribution across the pupil for the other optical element whose [110] crystal axis is tilted with respect to the optical axis.

FIG. 5 shows a schematic representation of variations in birefringence magnitude and birefringence axis orientation in angular space for the cubic crystal of the lens L2. Since the lattice of this crystal is rotated ("clocked") by −90° around the Z direction as has been explained above, the birefringence axis orientation is rotated as well, whereas the magnitude of the birefringence is not altered by this rotation.

The circle 38 drawn in broken lines indicates the situation if the crystal lattice of the lens L2 would not have been tilted by an angle $\theta_2$. Since the aperture angle $\alpha_2$ is larger for light rays entering the lens L2, the circle 38 indicating possible angles of incidence has a larger diameter than the circle 36 shown in FIG. 4 for the lens L1. When comparing the circles 36 and 38, it can be seen that, for a particular angle of incidence, the magnitudes of birefringence are the same, but the orientations of the birefringence are orthogonal. This means that in one crystal a first polarization state is retarded, whereas in the other crystal an orthogonal polarization state is retarded.

If the induced retardances affect orthogonal polarization states and have equal magnitudes, the overall net retardance, i.e. the difference between the retardances induced by both crystals that causes retardance aberrations, will vanish. Since the retardance is the product of birefringence and path length, having equal retardances in both crystals requires that this product is, for a given light ray, the same in both crystals. The simplest way of achieving this condition is to keep, for each light ray, both the path length and the angle of incidence—and thus the birefringence—constant in both crystals.

As can be seen in FIG. 2, the ray 24 propagates through the lens L2 along a larger path length than in the lens L1, because the lens L2 is thicker than the lens L1 and entered by the ray 24 at a larger aperture angle ($\alpha_2 > \alpha_1$). It will be assumed in this example that the effect of the larger path length in the lens L2 will not be completely offset by the smaller magnitude of the birefringence that is a result of the larger angle of incidence. Consequently, the retardance for ray 24 induced by the lens L2 will be larger than the retardance induced by the lens L1. Hence, for crystal axes $[110]_1$ and $[110]_2$ being perfectly aligned along the Z axis, there will be no complete compensation of retardances as explained above since the magnitudes of the retardance of the lenses L1 and L2 differ.

However, since the crystal lattice of lens L2 is tilted by the angle $\theta_2$, the ray 24 will have a larger angle of incidence, i.e. it will impinge on the crystal lattice of the lens L2 at a larger angle. This shift of the angles of incidence is indicated in FIG. 5 by a circle 40 drawn in a solid line. There it can be seen that, in the average, the magnitude of the birefringence indicated by the length of the plotted lines decreases; the orientation of the birefringence, however, is not significantly affected by tilting the crystal lattice because the direction of the plotted lines in the circle 40 is nearly the same as in the circle 38.

It should be noted that the decrease of the magnitude of the birefringence is only an average effect occurring when all possible angles of incidence are taken into account. A particular ray that would have impinged on the untilted crystal lattice at a large angle of incidence may now, after tilting the crystal lattice, have a decreased angle of incidence resulting in a larger magnitude of birefringence. Consider, for example, a ray that would be represented by a location at the lower rim of the circle 38. After tilting, this ray would be represented by a location at the lower rim of the circle 40 now placed in the center of the plot indicating the largest magnitude of birefringence. However, when taking the integral over the areas of both circles 38 and 40 it becomes clear that the magnitude of birefringence in circle 40 is, as a whole, smaller than in the circle 38.

From FIG. 5 it is also evident that the magnitude of the birefringence will decrease the more the crystal lattice is tilted with respect to the optical axis. The axis of birefringence, however, will significantly alter as soon as the possible angles of incidence exceed a certain value.

The lens L1 can also be replaced by a combination of two or more other lenses having, as a whole, the same or a very similar birefringence distribution as shown in FIG. 4. Such a combination, however, will generally result in different path lengths and thus different retardances than obtained in lens L1. By adjusting the tilting angle $\theta_2$ it is then possible to take this path length difference into account and to achieve a minimal overall net retardance or to improve at least one predefined retardance property of the group.

Figure 6:
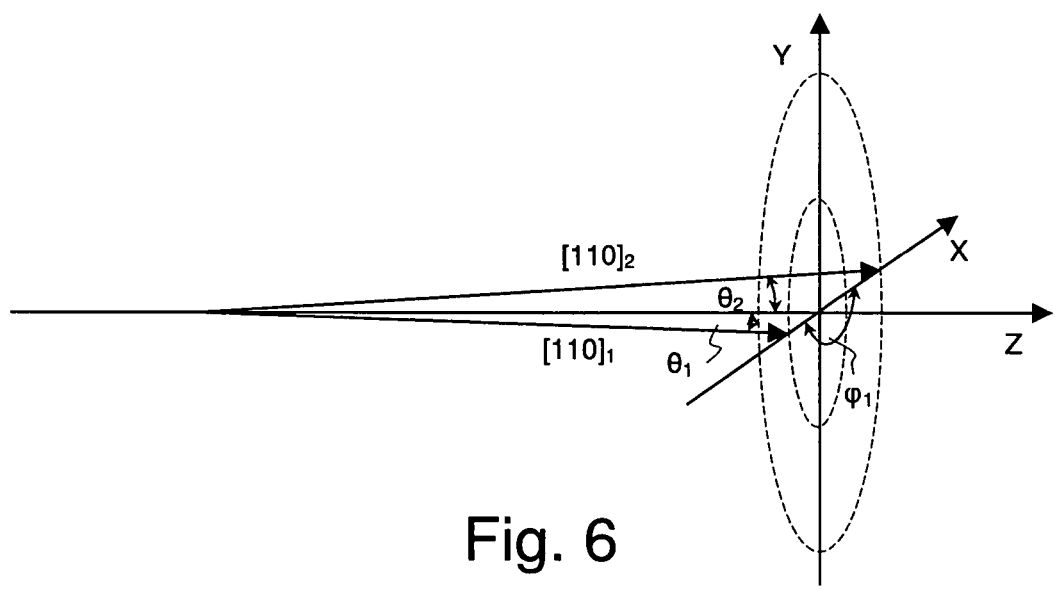
FIG. 6 is a diagram showing another possible orientation of the [110] optical axes of the crystal lattices for the optical elements shown in FIG. 2.

FIG. 6 shows the orientation of the $[110]_1$ and $[110]_2$ crystal axis for lenses L1 and L2, respectively, for another embodiment in which not only one, but both crystal lattices are tilted with respect to the optical axis 34. In this case, both crystal lattices are tilted around the Y direction. Furthermore, the crystal lattices of the lenses L1 and L2 are tilted in opposite directions so that the azimutal angles $\phi_1$ and $\phi_2$ differ by 180°.

It has been discovered that tilting those crystal lattices in opposite direction can be advantageous in various configurations, for example in conjunction with the beam splitter cube 16 comprising the polarization selective surface 28. This polarization selective surface 28 completely reflects and completely transmits components of the electric field of a ray that are orthogonal and parallel, respectively, to the plane of incidence. The latter is defined by the direction of the ray and the normal on the polarization selective surface 28. In an exemplary projection lens in which the lenses L1 and L2 had almost the same mean thickness, an improved pupil retardance distribution resulting in a better optical performance has been achieved with tilting angles $\theta_1$, $\theta_2$ of +4° and −2°, respectively.

FIGS. 7 and 8 show the most general case in which both crystal lattices are tilted around different axes that do not coincide with the X or Y direction. Consequently, the azimutal angles $\phi_1$ and $\phi_2$ are distinct from 0° or multiples of 90°. This means that the angular space for rays impinging on the lenses L1 or L2 is shifted in a direction given by the azimutal angle $\phi$. For the lens L2 and the azimutal angle $\phi_2$ the angular space is indicated in FIG. 7 by a circle 42. Since the axis orientation and magnitude of birefringence in cubic crystals in [110] direction is approximately independent of the azimutal angle and therefore rotationally symmetrical, no specific azimutal angle is particularly preferred. However, this is only an approximation, and in many cases a further improvement of the retardance properties can be achieved if a particular tilting axis is selected. Furthermore the fabrication of the optical elements can be simplified if the crystal lattices are tilted along a particular crystal axis.

The above description of the preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. An optical system comprising a group of optical elements that each comprise a birefringent cubic crystal having a crystal lattice, wherein
   the crystal lattices of the crystals have different orientations, and wherein
   a crystal axis of at least one optical element is tilted with respect to an optical axis of the optical system so that a predefined tilting angle having an absolute value between 6° and 12° is formed between said crystal axis and the optical axis, thereby improving at least one predefined retardance property of the group.

2. The optical system of claim 1, wherein the crystal lattices of the crystals are oriented with respect to each other such that the overall retardance of the group is reduced by mutual compensation.

3. The optical system of claim 1, wherein the tilting angle is defined such that the overall retardance of the group is reduced.

4. The optical system of claim 3, wherein the tilting angle is defined such that the overall retardance of the group is minimal.

5. The optical system of claim 1, wherein the tilting angle is defined such that the overall retardance of the group does not deviate more than 5% from a minimum value that would be obtained with an ideal tilting angle.

6. The optical system of claim 1, wherein the tilting angle is defined such that the angular retardance distribution of the group has a predetermined form.

7. A photolithography tool comprising an optical system of claim 1.

8. The photolithography tool of claim 7, comprising a projection lens having a catadioptric part in which the at least one optical element is mounted.

9. A semiconductor device formed on a substrate and including circuit patterns that are formed by a photolithography tool of claim 7.

10. An optical system comprising a group of optical elements that each comprise a birefringent cubic crystal having a crystal lattice, wherein the crystal lattices of the crystals have different orientations, and wherein a [110] crystal axis of at least one optical element is tilted with respect to an optical axis of the optical system so that a predefined tilting angle having an absolute value between 1° and 20° is formed between said [110] crystal axis and the optical axis, thereby improving at least one predefined retardance property of the group, where the crystal lattice of the at least one optical element is oriented so that a crystal axis orthogonal to the [110] crystal axis is perpendicular to the optical axis.

11. The optical system of claim 10, wherein the group of optical elements comprises a further optical element having a crystal lattice rotated by 90° around its [110] crystal axis relative to the [110] crystal axis of the at least one optical element, and oriented so that the [110] crystal axis of the further optical element is parallel to the optical axis of the optical system.

12. The optical system of claim 10, wherein the group of optical elements comprises a further optical element having a crystal lattice rotated by 90° around its [110] crystal axis relative to the [110] crystal axis of the at least one optical element, and oriented so that the [110] crystal axis of the further optical element is tilted with respect to the optical axis of the system by a predefined tilting angle having an absolute value between 1° and 20°.

13. The optical system of claim 12, wherein the [110] crystal axis of the at least one optical element and the [110] crystal axis of the further optical element are tilted in opposite tilting directions with respect to the optical axis.

14. The optical system of claim 10, wherein the at least one optical element is mounted within the optical system such that an aperture angle of light rays impinging on the at least one optical element is less than 20°.

15. The optical system of claim 10, wherein the absolute value of the tilting angle with respect to the optical axis is between 6° and 12°.

16. The optical system of claim 10, wherein the crystal lattices of the crystals are oriented with respect to each other such that the overall retardance of the group is reduced by mutual compensation.

17. The optical system of claim 10, wherein the tilting angle with respect to the optical axis is defined such that the overall retardance of the group is reduced.

18. The optical system of claim 17, wherein the tilting angle with respect to the optical axis is defined such that the overall retardance of the group is minimal.

19. The optical system of claim 10, wherein the tilting angle with respect to the optical axis is defined such that the overall retardance of the group does not deviate more than 500 from a minimum value that would be obtained with an ideal tilting angle.

20. The optical system of claim 10, wherein the tilting angle with respect to the optical axis is defined such that the angular retardance distribution of the group has a predetermined form.

21. A photolithography tool comprising an optical system of claim 20.

22. The photolithography tool of claim 21, comprising a projection lens having a catadioptric part in which the at least one optical element is mounted.

23. A semiconductor device formed on a substrate and including circuit patterns that are formed by a photolithography tool of claim 21.

24. The optical system of claim 10, wherein the crystal axis perpendicular to the optical axis is the [1-10] crystal axis.

25. The optical system of claim 10, wherein the crystal axis perpendicular to the optical axis is the [00-1] crystal axis.

26. An optical system comprising a group of optical elements that each comprise a birefringent cubic crystal having a crystal lattice, wherein the crystal lattices of the crystals have different orientations, a [110] crystal axis of at least a first optical element is tilted with respect to an optical axis of the optical system so that a predefined tilting angle having an absolute value between 1° and 20° is formed between said [110] crystal axis and the optical axis, thereby improving at least one predefined retardance property of the group, and where the crystal lattice of the first optical element is oriented so that a crystal axis orthogonal to the [110] crystal axis is perpendicular to the optical axis, a crystal lattice of a second optical element of the group is rotated by 90° around its [110] crystal axis relative to the [110] crystal axis of the first optical element, and oriented so that the [110] crystal axis of the second optical element is tilted with respect to the optical axis of the system by a predefined tilting angle having an absolute value between 1° and 20°, and the [110] crystal axis of the first optical element and the [110] crystal axis of the second optical element are tilted in opposite tilting directions with respect to the optical axis.

27. The optical system of claim 26, wherein the crystal axis of the first optical element perpendicular to the optical axis is the [1-10] crystal axis.

28. The optical system of claim 26, wherein the crystal axis of the first optical element perpendicular to the optical axis is the [00-1] crystal axis.

* * * * *

UNITED STATES PATENT AND TRADEMARK OFFICE
CERTIFICATE OF CORRECTION

PATENT NO. : 7,355,791 B2
APPLICATION NO. : 11/251300
DATED : April 8, 2008
INVENTOR(S) : Kamenov et al.

Page 1 of 1

It is certified that error appears in the above-identified patent and that said Letters Patent is hereby corrected as shown below:

In Column 3, line 56, after "axes" delete ".".

In Column 7, line 59, delete "azimutal" and insert -- azimuthal --, therefor.

In Column 9, line 55, delete "azimutal" and insert -- azimuthal --, therefor.

In Column 10, line 7, delete "azimutal" and insert -- azimuthal --, therefor.

In Column 10, line 10, before "angle $\varphi$." delete "azimutal" and insert -- azimuthal --, therefor.

In Column 10, line 10, before "angle $\varphi_2$" delete "azimutal" and insert -- azimuthal --, therefor.

In Column 10, line 14, delete "azimutal" and insert -- azimuthal --, therefor.

In Column 10, line 15, delete "azimutal" and insesrt -- azimuthal --, therefor.

In Column 11, line 54, in Claim 19, delete "500" and insert -- 5% --, therefor.

Signed and Sealed this

Fifteenth Day of July, 2008

JON W. DUDAS
*Director of the United States Patent and Trademark Office*